United States Patent [19]

Sugawara

[11] Patent Number: 5,572,048
[45] Date of Patent: Nov. 5, 1996

[54] VOLTAGE-DRIVEN TYPE SEMICONDUCTOR DEVICE

[75] Inventor: Yoshitaka Sugawara, Hitachi, Japan

[73] Assignee: Hitachi, Ltd., Tokyo, Japan

[21] Appl. No.: 153,047

[22] Filed: Nov. 17, 1993

[30] Foreign Application Priority Data

Nov. 20, 1992 [JP] Japan .................................. 4-311532

[51] Int. Cl.$^6$ ........................... H01L 29/74; H01L 31/111
[52] U.S. Cl. .......................... 257/132; 257/139; 257/212; 257/378
[58] Field of Search .................................. 257/132, 139, 257/212, 341, 378

[56] References Cited

U.S. PATENT DOCUMENTS 4,821,095  4/1989  Temple .................................. 357/23.4

FOREIGN PATENT DOCUMENTS

| 0080044 | 9/1982 | European Pat. Off. .. |
| 0146181 | 12/1984 | European Pat. Off. .. |
| 0185415 | 11/1985 | European Pat. Off. .. |
| 0322041 | 12/1988 | European Pat. Off. .. |
| 0407011 | 5/1990 | European Pat. Off. .. |
| 1305557 | 12/1989 | Japan . |
| 411780 | 12/1989 | Japan . |
| 2067766 | 3/1990 | Japan . |
| 387068 | 4/1991 | Japan . |
| 03148873 | 6/1991 | Japan . |
| 4014263 | 1/1992 | Japan . |
| 4162776 | 6/1992 | Japan . |
| 2166291 | 10/1985 | United Kingdom . |

OTHER PUBLICATIONS

Temple, "MOS–Controlled Thyristors–A New Class of Power Devices", IEEE, 1986.
Ishidoh et al., "Advanced High Frequency GTO", Proceedings of 1988 Int'l Symposium on Power Semiconductor Devices, Tokyo, pp. 189–194.
Ajit, J. S., et al. "The Minority Carrier Injection Controlled Field–Effect Transistor . . . " IEEE Trans. on Elec. Dev., vol. 39, No. 8, Aug. 1992, pp. 1954–1958.

Primary Examiner—Sara W. Crane
Attorney, Agent, or Firm—Antonelli, Terry, Stout & Kraus

[57] ABSTRACT

According to the present invention, a MOSFET is formed of an n source, a p well, an n drain and a MOS gate electrode, a bipolar transistor is formed of an n emitter, a p base and an n collector formed in sequential order adjacent to the n drain. These transistors are formed by being merged with each other by the contact of n drain and the n emitter of the same conductivity type. Holes are injected into the drain of a voltage-driven type transistor comprised of the MOSFET from the bipolar transistor having a very small collector saturation resistance. With this, it is possible to give rise to conductivity modulation in the drain of the MOSFET, while the power dissipation of the voltage-driven type semiconductor device becomes very small.

2 Claims, 11 Drawing Sheets

VOLTAGE-DRIVEN TYPE SEMICONDUCTOR DEVICE

BACKGROUND OF THE INVENTION

The present invention relates to a voltage-driven type semiconductor device, and more particularly to a voltage-driven type semiconductor device suitable to be used for a power converter and a power source of various power capacities, a power amplifier, an oscillator, an analog switch or the like as a single device or by integrating a plurality of such devices into an IC.

As voltage-driven type semiconductor devices of this sort according to prior art techniques, a MOSFET, an SI transistor, an IGBT, a MOS thyristor and so on are known. Being driven by voltage, these semiconductor devices have such a feature that the power dissipation for driving is very small as compared with a current-driven type semiconductor device. Further, MOSFETs and SI transistors have an advantage that an on-current can be applied even in case of low on-voltage in the vicinity of 0 V. On the other hand, in such devices it is required to relieve an electric field intensity by expanding a depletion layer into a drain region and also to lower impurity concentration in the drain region in order to use the devices at a high voltage.

Thus, in a high voltage MOSFET and a high voltage SI transistor, resistance of a drain region becomes high. As a result, the on-resistance of the whole element becomes high, and the power dissipation of the element becomes very large.

A different type of voltage-driven device, known as an IGBT, is described in, for instance, JP-A-4-11780.

The IGBT according to this prior art arrangement is a voltage-driven type semiconductor device in which an emitter for carrier injection is connected to a drain of a MOSFET. Since carriers (such as holes) are injected into the drain in the on-state of the element and conductivity modulation is produced, the IGBT has such an advantage that the on-resistance thereof can be reduced to approximately ¼ of that of a MOSFET even when it is designed for a high voltage. A consequence, it is possible to reduce the power dissipation of the device by a large margin.

The IGBT which is a voltage-driven type semi-conductor device, however, is latched up when carriers (such as electrons) having a different polarity are injected from the source thereof. Therefore, it is of vital importance to check injection of the carriers having a different polarity, thereby to prevent voltage control from becoming inexecutable by latch-up.

Another prior art technique is described in, for example, IEEE Trans. Electron Devices, Vol. ED-33, pp. 1609–1618 (1986) written by V.A.K. Temple, JP-A-3-87068, and is known as a prior art arrangement related to a MOS thyristor which is a voltage-driven type semiconductor device.

A MOS thyristor according to this prior art arrangement has basically a pnpn structure similar to that of an IGBT, in which carriers (such as electrons) are injected positively also from an emitter corresponding to a source of the IGBT and conductivity modulation in a base region corresponding to a drain of the IGBT is made deeper so as to generate latch-up, thereby to further reduce the on-resistance even more than an IGBT. Thus, it is possible to reduce the power dissipation in this MOS thyristor lower than the IGBT described above by a large margin.

However, it has been required in such prior art MOS thyristors to include inside the MOSFET an arrangement for short-circuiting the emitter junction in order to make it possible to control the off-voltage after latch-up.

Since the on-resistance can be reduced remarkably in the IGBT and the MOS thyristor according to a prior art as compared with a MOSFET as described above, they are suitable to be used for high voltage and large current. In these elements, however, it is impossible to apply a current from the vicinity of 0 V, and voltage drop caused by the junction at about 0.6 to 0.8 V exists. Therefore, power dissipation by the voltage drop portion is produced even if conductivity modulation is made sufficiently deep, thus limiting reduction in power dissipation of the whole element. Namely, a linear characteristic has been unobtainable in volt-ampere characteristics of these elements.

The voltage-driven type semiconductor device such as an IGBT and a MOS thyristor according to a prior art described above has a problem that reduction of power dissipation of the whole element is limited since voltage drop caused by the junction at about 0.6 to 0.8 V exists and power dissipation caused by the voltage drop portion is produced even when conductivity modulation is made sufficiently deep.

SUMMARY OF THE INVENTION

It is an object of the present invention to solve the problem described above and have a voltage-driven type semiconductor device be provided with the effect of reduction of the on-resistance by conductivity modulation like an IGBT and a MOS thyristor, and to provide a voltage-driven type semiconductor device capable of substantially eliminating the voltage drop caused in prior art devices by the junction, reducing power dissipation to the minimum, and in particular, capable of obtaining remarkable effects of reducing power dissipation in use for high breakdown voltage and high current.

According to the present invention, the above-mentioned object can be achieved by merging a drain of a voltage-driven type transistor such as a MOSFET and an SI transistor with a bipolar transistor having an emitter composed of a semiconductor of the same conductivity type as that of this drain, viz., by providing an emitter of a bipolar transistor of the same polarity and then a base and a collector successively with the drain of the voltage-driven type transistor.

Further, the above-mentioned object is achieved by merging the drain of the voltage-driven type transistor with the emitter of the bipolar transistor in one.

In a voltage-driven type semiconductor device according to the present invention, carriers (such as electrons) flow from the source of the voltage-driven type transistor to the drain through a channel at time of on-operation. The carriers (such as electrons) flow into the emitter of the bipolar transistor as they are since the drain and the emitter of the bipolar transistor are formed of semiconductor regions of the same conductivity type.

These carriers (such as electrons) flowing into the emitter are injected into the base of the bipolar transistor, thus generating transistor operation. When an injection efficiency of the carriers (such as electrons) into the base and a transfer efficiency of the carriers in the base are kept high, the transistor is brought into a saturation state easily. As is generally known, since junctions of the emitter and the collector of the transistor are both brought into a forward bias state in the saturated state, the collector saturation voltage corresponding to the difference between both forward bias states is very small, thus making it possible to make a collector saturation resistance very small.

On the other hand, when carriers (such as electrons) are injected into the base, injection of carriers (such as holes) having a reverse polarity from the base to the emitter occurs, and these carriers (such as holes) of the reverse polarity diffuse into the drain of the voltage-driven type transistor and give rise to conductivity modulation, thus reducing the resistance of the drain by a large margin (approximately ¼).

As described previously, in a voltage-driven type semiconductor device of the present invention, it is possible to set the resistance between main electrodes to a very small resistance (such as 10 milliohms or lower) which is determined principally by a channel resistance, a pinch resistance, a conductivity-modulated drain resistance of a voltage-driven type transistor and a collector saturation resistance of a bipolar transistor and so on. Moreover, since the voltage drop by junction does not exist, it is possible to make power dissipation very small. Namely, the volt-ampere characteristic thereof substantially becomes linear.

Further, in a voltage-driven type semiconductor device according to the present invention, since it is possible to have only the voltage-driven type transistor bear the breakdown voltage, the bipolar transistor can be made to be of low breakdown voltage, thus making it possible to increase the impurity concentration of the collector of the bipolar transistor and to make the collector saturation resistance very small.

Furthermore, since the emitter of the bipolar transistor is set to a comparatively high concentration in the voltage-driven type semiconductor device according to the present invention in order to realize transistor operation, it is possible to control the carriers (such as holes) of a reverse polarity injected into the emitter from the base moderately. Namely, it is possible to provide the emitter of the bipolar transistor with a function for controlling the carriers (such as holes) of a reverse polarity similar to a buffer layer in an IGBT moderately, thus making it possible to prevent latch-up by injection of carriers (such as electrons) from the source which is generated when the voltage-driven type transistor is a MOSFET.

In one embodiment of the present invention, a semiconductor region where carriers are injected is merged with the drain region in order to adjust the conductivity of the drain region of the MOSFET. An electrode is provided in the semiconductor region for carrier injection, and bias voltage is applied to this electrode independently of the MOSFET. With this, the linearity of the volt-ampere characteristic of the device is guaranteed.

DESCRIPTION OF THE PREFERRED EMBODIMENTS

Embodiments of a voltage-driven type semiconductor device according to the present invention will be described in detail hereinafter with reference to the drawings.

Figure 1:
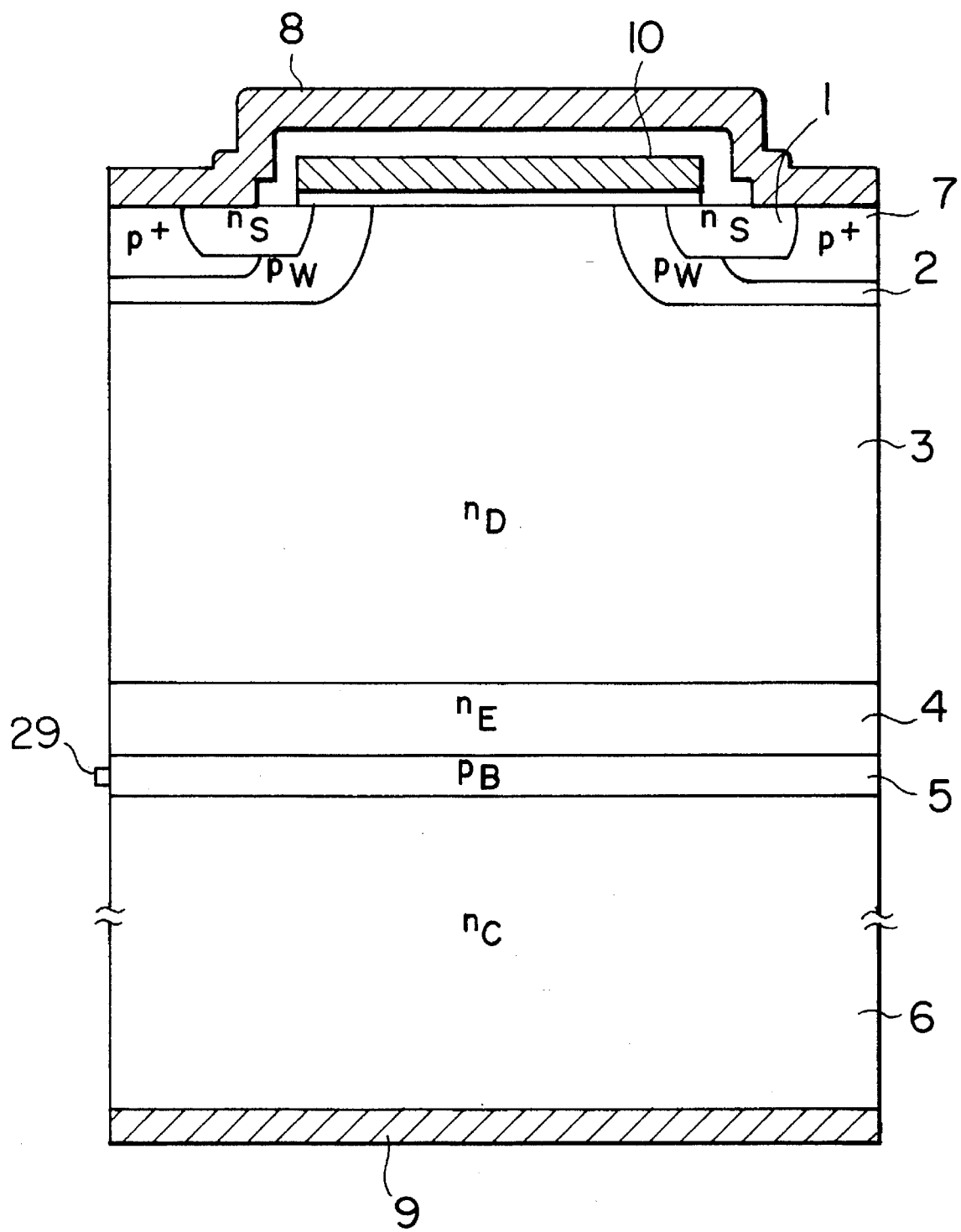
FIG. 1 is a sectional view for explaining a structure of a voltage-driven type semiconductor device according to an embodiment of the present invention.

FIG. 1 is a sectional view for explaining a structure of a first embodiment according to the present invention. In FIG. 1, a reference numeral 1 represents an n source (a third semiconductor region), 2 a p well (a second semiconductor region), 3 an n drain (a first semiconductor region), 4 an n emitter (a fourth semiconductor region), 5 a p base (a fifth semiconductor region), 6 an n collector (a sixth semiconductor region), 7 a $p^+$ layer, 8 and 9 main electrodes, and 10 a MOS gate electrode. 29 represents an electrode for applying a bias to the p base 5, and this electrode is controlled independently of the main electrodes 8 and 9 and the electrode 10.

The first embodiment of the present invention shown in FIG. 1 is an example of a voltage-driven type semiconductor device in 600 V.100 A class, and FIG. 1 shows a segment structure thereof. The width of the segment is approximately 40 μm, and other structure parameters are as follows.

The surface impurity concentrations of the n source 1 and the p well 2 are $5 \times 10^{19}/cm^3$ and $5 \times 10^{17}/cm^3$, and depths of junction are 1.5 μm and 3 μm, respectively. Impurity concentrations of respective layers, the n drain 3, the n emitter 4, the p base 5 and the n collector 6 are $1.3 \times 10^{14}/cm^3$, $1 \times 10^{18}/cm^3$, $1 \times 10^{18}/cm^3$ and $1 \times 10^{17}/cm^3$, respectively, and thicknesses are 60 μm, 10 μm, 1.5 μm and 450 μm, respectively. Further, dopants added to respective regions are such that phosphorus to the n source 1, the n drain 3 and the n collector 6, arsenic to the n emitter 4 and boron to the p well 2 and the p base 5.

Further, the $p^+$ layer 7 is an impurity layer of high concentration for preventing the illustrated semiconductor device from latching-up and making control by the gate impossible.

In the illustrated first embodiment of the present invention, a MOSFET which is a voltage-driven type transistor is formed of the n source 1, the p well 2 and the n drain 3, and a bipolar transistor is formed of the n emitter 4, the p base 5 and the n collector 6, thus forming the whole semiconductor device. The n drain 3 and the n emitter 4 are semiconductor layers having the same conductivity type.

In the semiconductor device according to the first embodiment of the present invention, the potential of the main electrode 9 is set higher than the potential of the main electrode 8, and the potential of the p base 5 is set higher than the potential of the n emitter 4 by a predetermined potential (approximately 0.6 V) or higher, and gate voltage is applied to the MOS gate electrode 10 so that the potential of the MOS gate electrode 10 becomes higher than the potential of the main electrode 8. When the gate voltage exceeds a threshold voltage, the semiconductor device is turned on by a mechanism described hereunder.

Namely, when the gate voltage as described previously is applied, an n channel is formed on the surface of the p well 2 under the MOS gate electrode 10, electrons flow into the n drain 3 from the n source 1 through this channel, and then, these electrons flow into the n emitter 4. Thereafter, these electrons are injected into the p base 5 and diffused in the p base 5, and flow into the main electrode 9 through the n collector.

Since the first embodiment of the present invention has structure parameters as described previously, the injection efficiency into the base and the transfer efficiency in the base of electrons in the bipolar transistor are sufficiently high and it is trially estimated that a common base current gain reaches to approximately 0.964. As a result, the bipolar transistor is brought into a saturation state easily, the collector saturation voltage becomes very low, and the collector saturation resistance shows a very small value of approximately 4 m$\Omega$.

The breakdown voltage of the semiconductor device according to the first embodiment of the present invention is approximately 650 V, but the breakdown voltage is borne by the MOSFET portion principally, and the breakdown voltage of the bipolar transistor portion is approximately 10 V at most. Since it is possible to have the bipolar transistor portion show a low breakdown voltage as described above in the semiconductor device according to the first embodiment of the present invention, the impurity concentration of the n collector 6 can be increased sufficiently high. Thus, it is possible to control the resistance in the collector portion to be sufficiently low to realize a very low collector saturation resistance as described previously.

Now, when attention is paid to the MOSFET portion, the holes from the p base 5 are injected into the n emitter 4, these holes are diffused in the n emitter 4, and then, these holes are diffused in the n drain 3. As a result that the n emitter 4 is set at proper impurity concentration and thickness as the structure parameters described above, the holes diffused in the n emitter 4 can reach the n drain 3 without vanishing excessively by recombination in the n emitter 4. Thus, the inside of the n drain 3 is filled with enough holes for generating sufficient conductivity modulation.

Since the concentration of these holes is trially estimated at approximately $7\times10^{16}$/cm$^3$, the resistance of the n drain 3 is reduced to a little less than 1 m$\Omega$. The resistance between the main electrodes of the semiconductor device according to the first embodiment of the present invention is principally the total of the channel resistance, the pinch resistance, the conductivity-modulated drain resistance of the MOSFET, and the collector saturation resistance and the contact resistance at the main electrode portion of the bipolar transistor or the like, but it still shows a sufficiently small value of approximately 11 m$\Omega$.

The device of the present embodiment performs the same operation as a generally known IGBT in point of conductivity modulation of the n drain 3. However, the voltage drop by junction between the n drain 3 and the n emitter 4 disappears for all practical purposes. Accordingly, the volt-ampere characteristic between the main electrodes 8 and 9 shows a substantially linear form.

Then, the semiconductor device according to the first embodiment of the present invention shows the voltage drop of approximately 1.1 V and the power dissipation of approximately 110 W at time of 100 A conduction (current density: 100 A/cm$^2$), which are sufficiently small values as compared with a voltage-driven type semiconductor device which has been heretofore reported.

Besides, in the semiconductor device according to the first embodiment of the present invention, electron rays are radiated in order to shorten turn-off time, and the turn-off time is approximately 0.9 $\mu$s. Further, according to this semiconductor device, the current density generated by latch-up becomes sufficiently high and reaches 700 A/cm$^2$ or higher by reduction of the resistance of the p well 2 under the n source 1, by the reduction of the width of the n source 1, and formation of the p$^+$ layer 7, and rationalization of injection of the holes from the p base 5 by the n emitter 4.

The semiconductor device according to the first embodiment of the present invention has a possibility to latch up since a parasitic thyristor portion formed of the p well 2, the n drain 3, the n emitter 4, the p base 5 and the n collector 6 is brought into a forward bias state at the time of a reverse bias for the semiconductor device.

In order to prevent the above, it is recommended to use the semiconductor device according to the first embodiment of the present invention so that the potential of the MOS gate electrode 10 reaches higher than the potential of the main electrode 8 over the threshold voltage or higher. For example, it is recommended to continuously apply gate voltage of the same polarity and the same voltage as those at time of forward bias between the main electrode 8 and the MOS gate electrode 10.

As a result, in the semiconductor device according to the first embodiment of the present invention, the MOSFET portion formed of the n source 1, the p well 2 and the n drain 3 is turned on and an anode of the parasitic thyristor and the p well 2 and the n drain 3 working as the n base are short-circuited by a very low resistance at the time of reverse bias, thus making it possible to prevent latch-up from occurring.

Besides, in the case of the first embodiment of the present invention, the electrode 100 giving a potential to the p base 5 can be formed by using a well-known method by a GTO or the like which is disclosed in Proceedings of 1988 International Symposium on Power Semiconductor Devices, pp. 189–194 for instance. Namely, a block is structured with a plurality of segments, a groove is formed around the block by etchdown from the silicon surface on the side of the main electrode 8, a p layer is formed from the bottom of the groove so as to come into contact with the p base 5, and an electrode is formed on the surface thereof, thus making it possible to form an electrode which provides the p base 5 with a potential.

An electrode which supplies the n emitter 4 with a potential can be produced by forming an n layer on the inside of the p layer at the bottom of the groove mentioned above so as to come into contact with the n emitter 4 and forming an electrode on the surface thereof in a similar manner to the above. It is a matter of course that the method of forming these electrodes is not limited to this example. For example, when a chip of the semiconductor device is small, it is possible to realize exactly the same function by forming these electrodes around the chip by a similar method.

Next, a second and a third embodiments of the present invention will be described. In these second and third embodiments of the present invention, the impurity concentrations of the n emitter 4, the p base 5 and the n drain 3 in the first embodiment of the present invention described above are changed.

The second embodiment of the present invention shows an example in which the impurity concentration of the p base 5 is altered to $2\times10^{17}/cm^3$ and the rest is kept the same as the first embodiment.

As a result, it is possible to further improve the injection efficiency into the base and the transfer efficiency in the base of electrons, the common base current gain of the bipolar transistor is trially estimated to reach approximately 0.987, and it is possible to further reduce the collector saturation voltage of the bipolar transistor to a very low value. On the other hand, the concentration of the holes dispersed in the n drain 3 becomes slightly lower, and the resistance of the n drain 3 becomes slightly higher since conductivity modulation is slightly reduced.

As a consequence, the resistance between main electrodes of the semiconductor device according to the second embodiment of the present invention shows a sufficiently small value of approximately 9.5 m$\Omega$. Further, the voltage drop and the power dissipation in the semiconductor device according to the present embodiment at time of 100 A conduction (current density: 100 A/cm$^2$) become approximately 0.95 V and approximately 95 W, respectively. Thus, it is possible to further reduce these values to lower than the first embodiment of the values in the present invention.

The third embodiment of the present invention shows an example in which the impurity concentration of the p base 5 is altered to $2\times10^{17}/cm^3$ and the impurity concentration of the n emitter 4 and the n drain 3 are both altered to $1\times10^{15}/cm^3$, and the rest is kept the same as the first embodiment.

As a result, the injection efficiency of electrons into the base is lowered, the common base current gain is trially estimated to reach approximately 0.743, and the collector saturation voltage of the bipolar transistor is increased. However, since the concentration of the holes diffused in the n drain 3 is increased and the conductivity modulation is slightly increased, the resistance of the n drain 3 becomes slightly lower.

As a consequence, the collector saturation resistance of the bipolar transistor becomes dominant and becomes approximately 21.5 m$\Omega$ in the resistance between the main electrodes of the semiconductor device according to the third embodiment of the present invention. Further, the voltage drop and the power dissipation of the semiconductor device according to the present invention at the time of 100 A conduction (current density: 100 A/cm$^2$) become approximately 2.15 V and approximately 215 W, respectively, which is not a great difference from the voltage-driven type semiconductor device which has been heretofore reported. On the other hand, the latch-up current is reduced by a large margin. As can be understood from this embodiment, it is possible to remove the boundary between the emitter 4 and the drain 3, that is, to adopt a structure using one n-type semiconductor layer in common for a MOSFET and a bipolar transistor.

From the inventor's studies, it has been determined by simulation in which the impurity concentration of the p base 5 and the impurity concentration of the n drain 3 are changed, that it is preferred to make the common base current gain to be approximately 0.7 or above.

Further, a bipolar transistor is formed of the n emitter 4, the p base 5 and the n collector 6 in the embodiment of the present invention described above, which, however operates also as a transistor when the emitter of this transistor is used as a collector and the collector of this transistor is used as an emitter conversely to the above. According to the present invention, it could be clarified that it was required that the common base current gain of the former bipolar transistor was larger than the common base current gain of the latter bipolar transistor in which the emitter and the collector of this transistor were replaced.

The principles of the foregoing discussion are also similarly applied to other embodiments described hereinafter.

Figure 2:
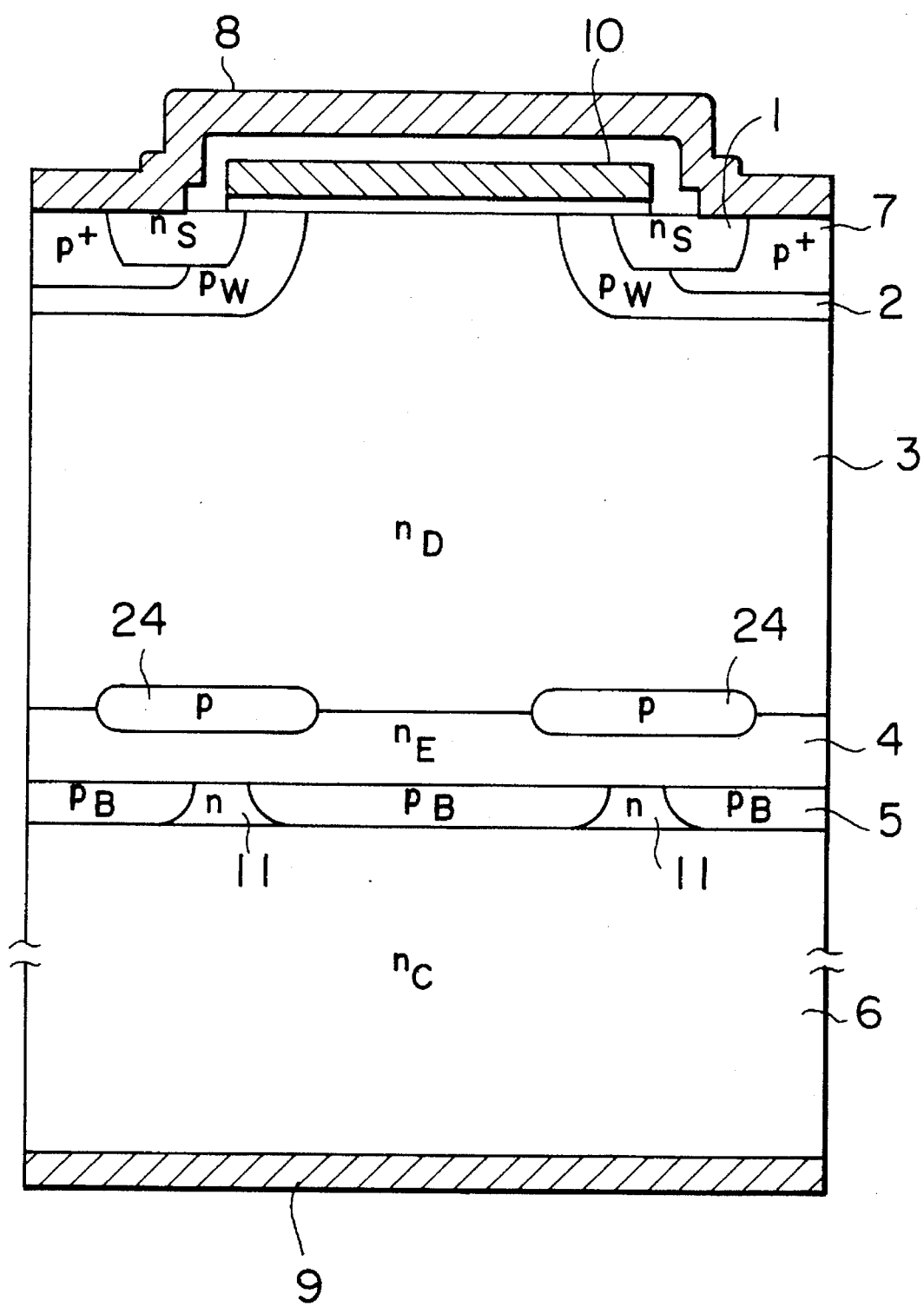
FIG. 2 is a sectional view for explaining a structure of a voltage-driven type semiconductor device according to another embodiment of the present invention.

FIG. 2 is a sectional view for explaining a structure of a fourth embodiment of the present invention. In FIG. 2, 11 represents an n layer (a seventh semiconductor region), 24 represents a p layer, and other reference numerals are the same as FIG. 1.

A voltage-driven type semiconductor device according to the fourth embodiment of the present invention is structured to be the same as the first embodiment except that the n layer 11 is formed in a part of the p base 5 and the p layer 24 is formed at a part of the junction between the n drain 3 and the n emitter 4.

In the fourth embodiment of the present invention structured as described above, the n layer 11 and the p layer 24 are formed in the widths of 4 μm and 10 μm, respectively. The n layer 11 is formed by selective diffusion of the p base 5 prior to epitaxial growth of the n emitter 4 on the n collector 6. Further, the p layer 24 is formed by selective diffusion of p-type impurities prior to epitaxial growth of the n drain 3 on the n emitter 4. The p base 5 has a thickness of approximately 1.5 μm, and impurity distribution thereof is controlled so as to realize almost the same transistor performance as the first embodiment of the present invention described previously.

In the semiconductor device according to the fourth embodiment of the present invention, the potential of the main electrode 9 is made higher than the potential of the main electrode 8, and gate voltage is applied to the MOS gate electrode 10 so that the potential of the MOS gate electrode 10 becomes higher than the potential of the main electrode 8. When the gate voltage exceeds a threshold voltage, the semiconductor device is turned on by a mechanism described hereunder.

Namely, when the gate voltage mentioned above is applied to the MOS gate electrode 10, an n channel is formed on the surface of the p well 2 under the MOS gate electrode 10, electrons flow into the n drain 3 from the n source 1 through this n channel, and then, these electrons flow into the n emitter 4. Thereafter, these electrons pass the n layer 11 through the n emitter 4 under the p layer 24, and flow into the n collector 6.

At this time, when the voltage drop in the n emitter 4 reaches approximately 0.6 V or higher, electrons are injected into the p base 5 from the n emitter 4 and holes are injected into the n emitter 4 from the p base 5, respectively, thus putting the bipolar transistor in operation. Now, since the resistance of the illustrated two n layers 11 is approximately 20 m$\Omega$, which is sufficiently large as compared with the collector saturation resistance of the bipolar transistor, almost no influence is exerted upon the saturation operation of the bipolar transistor at the time of forward bias.

When it is desired to further increase the resistance of the n layer 11, such an increase can be achieved easily by selecting the configuration of the n layer 11, for instance, forming the n layer 11 into a hole shape 4 μm in diameter, forming the n layer into a rectangular hole shape having one side 4 μm long and so on.

The fourth embodiment of the present invention is capable of reducing a turn-off speed as compared with the first to the third embodiments of the present invention by providing the n layer 11 described previously. Namely, the fourth embodiment of the present invention shown in FIG. 2 is operated so that the holes remaining in the n drain 3 are extracted toward the main electrode 9 through the n layer 11 at time of turn-off. Since it is possible to remove the holes quickly with the above discussed arrangement, the turn-off time can be shortened.

The fourth embodiment of the present invention has the turn-off time of approximately 0.4 μs and is able to reduce what is called a tail current by a large margin as compared with the first embodiment. As a result of the shortened turn-off time, a switching loss at the time of turn-off can be reduced by a large margin, and high-speed operation can be realized at a small loss.

Further, the fourth embodiment of the present invention has such a feature that the bias for the n emitter 4 and the p base 5 is not necessarily required. It is of course, to be understood that the present embodiment is also able to achieve similar effects to the first embodiment by providing an external bias providing an to the p base 5 which is 0.6 V or greater than the voltage at the n emitter 4.

Besides, the n layer 11 mentioned previously can also be formed by diffusing impurities such as As in the p base 5 after epitaxial growth of the p base 5 on the n collector 6, thus making it possible to realize similar effects.

Figure 3:
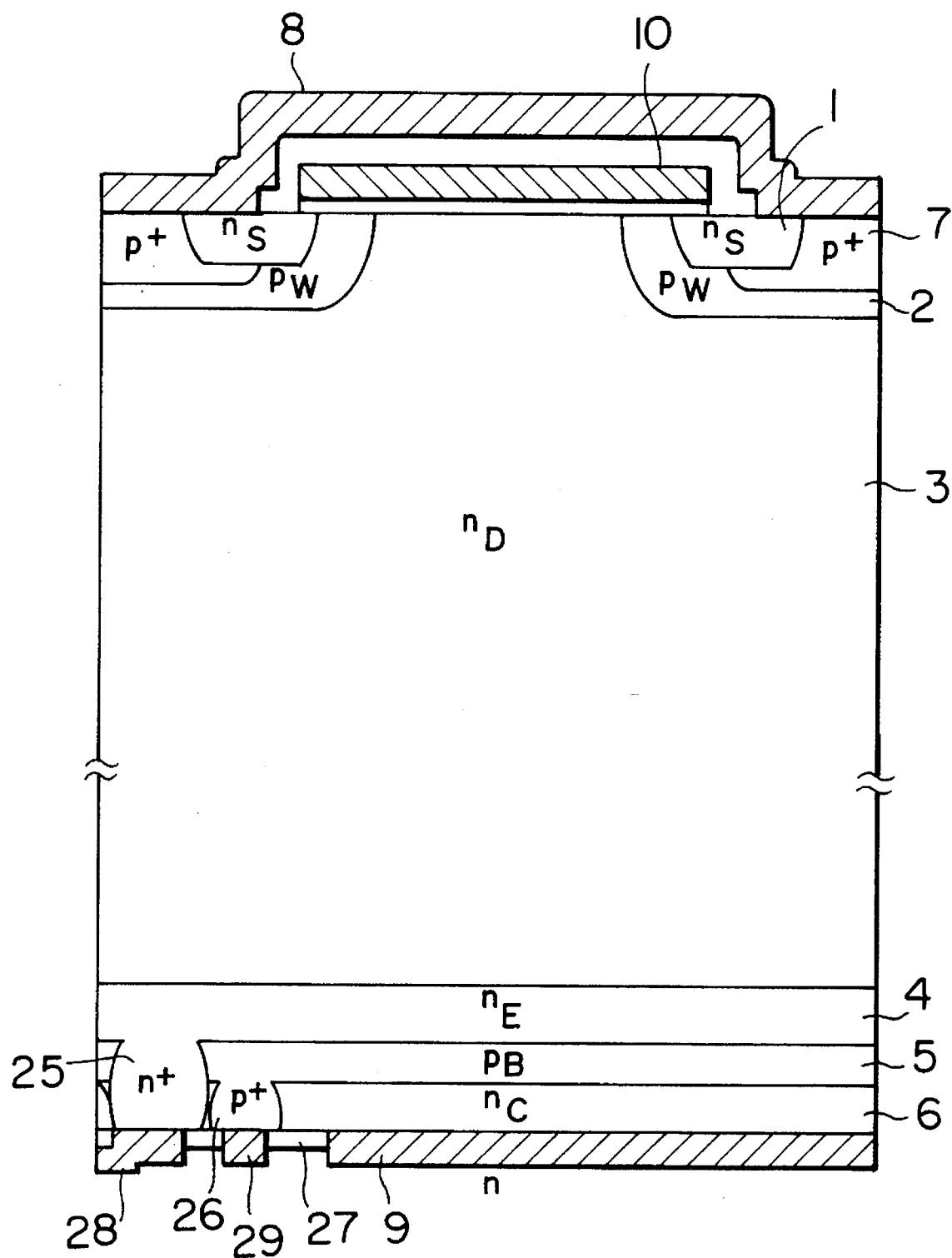
FIG. 3 is a sectional view for explaining a structure of a voltage-driven type semiconductor device according to still another embodiment of the present invention.

FIG. 3 is a sectional view for explaining a structure of a fifth embodiment of the present invention. In FIG. 3, 25 and 26 represent contact layers, 27 an oxide film, 28 and 29 electrodes, and other reference numerals are the same as FIG. 1.

The fifth embodiment of the present invention shown in FIG. 3 shows an example of a voltage-driven type semiconductor device in the 1,600 V class, and the width of a segment is approximately 70 μm. Further, the present embodiment differs from the first embodiment of the present invention described with reference to FIG. 1 in a point that a contact layer 25 with the n emitter 4 and a contact layer 26 with the p base 5 are formed by diffusion on the side of the main electrode 9, electrodes 28 and 29 are formed on each of them, and an oxide film 27 is made to lie between these electrodes and between the electrode and the main electrode 9, and is constituted the same as the case in FIG. 1 except with regard to the above point.

Further, the structure parameters of the present invention are almost the same as those in the first embodiment except that the impurity concentration of the n drain 3 is $5\times10^{13}/cm^3$ and the thickness thereof is 250 μm, and the impurity concentration of the n collector 6 is $1.5\times10^{17}/cm^3$ and the thickness thereof is approximately 5 μm.

In the fifth embodiment of the present invention, voltage is applied between electrodes 28 and 29 by a predetermined method so that the potential of the p base 5 is made higher than the potential of the n emitter 4 by a predetermined potential at approximately 0.6 V or higher, thus having the bipolar transistor perform saturated operation. The operation mechanism thereof is almost the same as that of the first embodiment of the present invention described previously. Hence, the description thereof is omitted.

In the fifth embodiment of the present invention, the lifetime of the holes is shortened by electron irradiation or the like so that high frequency operation at 60 KHz may be performed, but the voltage drop at the time of 50 A/cm² conduction is approximately 1.25 V. Thus, the voltage drop can be reduced to about ⅔ of a case according to prior device art, and power dissipation can also be reduced by a large margin as a result thereof.

Figure 4:
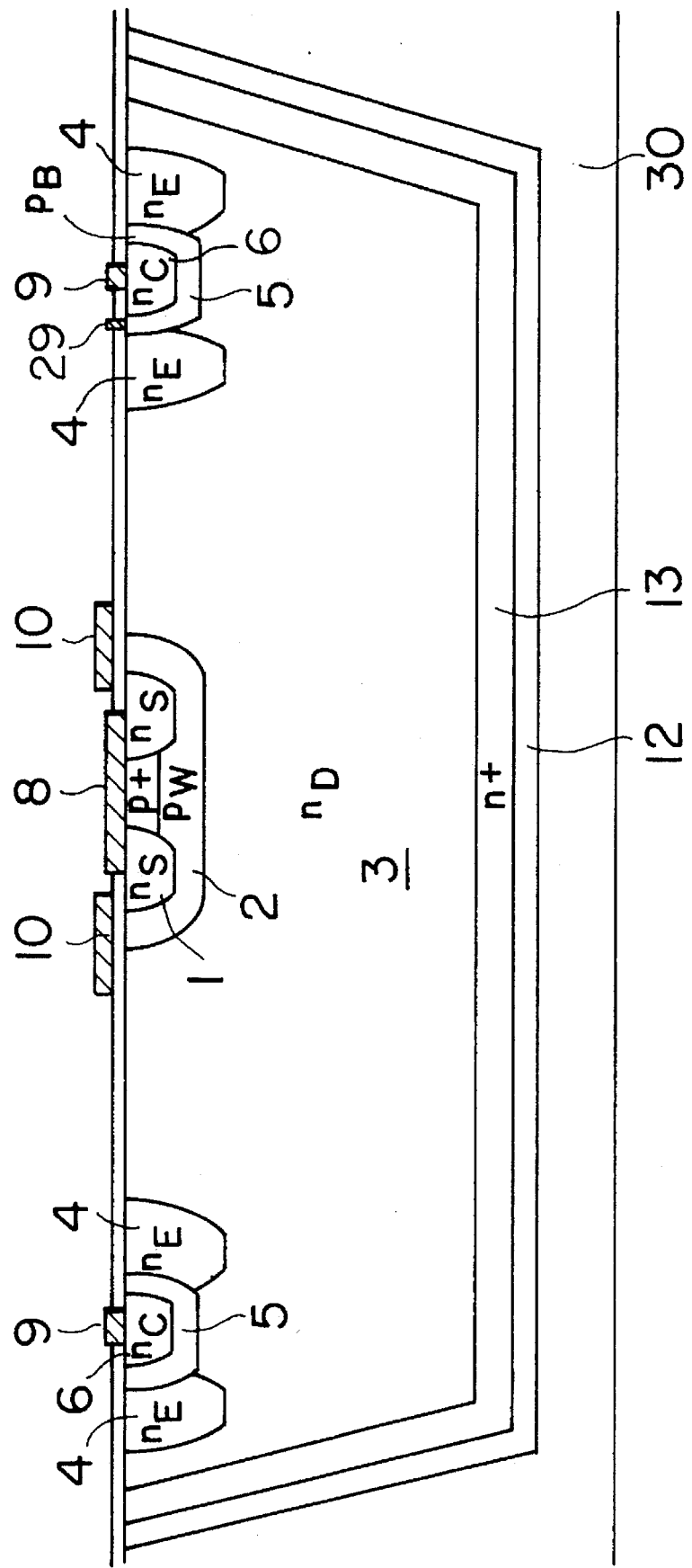
FIG. 4 is a sectional view for explaining a structure of a voltage-driven type semiconductor device according to another embodiment of the present invention.

FIG. 4 is a sectional view for explaining a structure of a sixth embodiment of the present invention. In FIG. 4, 12 represents an oxide film, 13 an n⁺ layer, 30 a polysilicon layer, and other reference numerals are the same as the case of FIG. 1.

The sixth embodiment of the present invention shown in FIG. 4 is formed in a lateral structure and integrated into a dielectrically isolated IC. Namely, the present embodiment is formed in a single crystal silicon island buried in a base material composed of the polysilicon 30 layer through the oxide film 12 for isolation, and is constructed with the n⁺ layer 13 added in order to make the drain resistance of the MOSFET portion small. The operation mechanism thereof is the same as the case of the first embodiment of the present invention which has been described already. Hence, the description thereof is omitted. In the semiconductor device according to the sixth embodiment of the present invention, the breakdown voltage is 450 V, the on-voltage at time of 2 A conduction is 0.9 V, and the on-voltage can be made sufficiently low.

Figure 5:
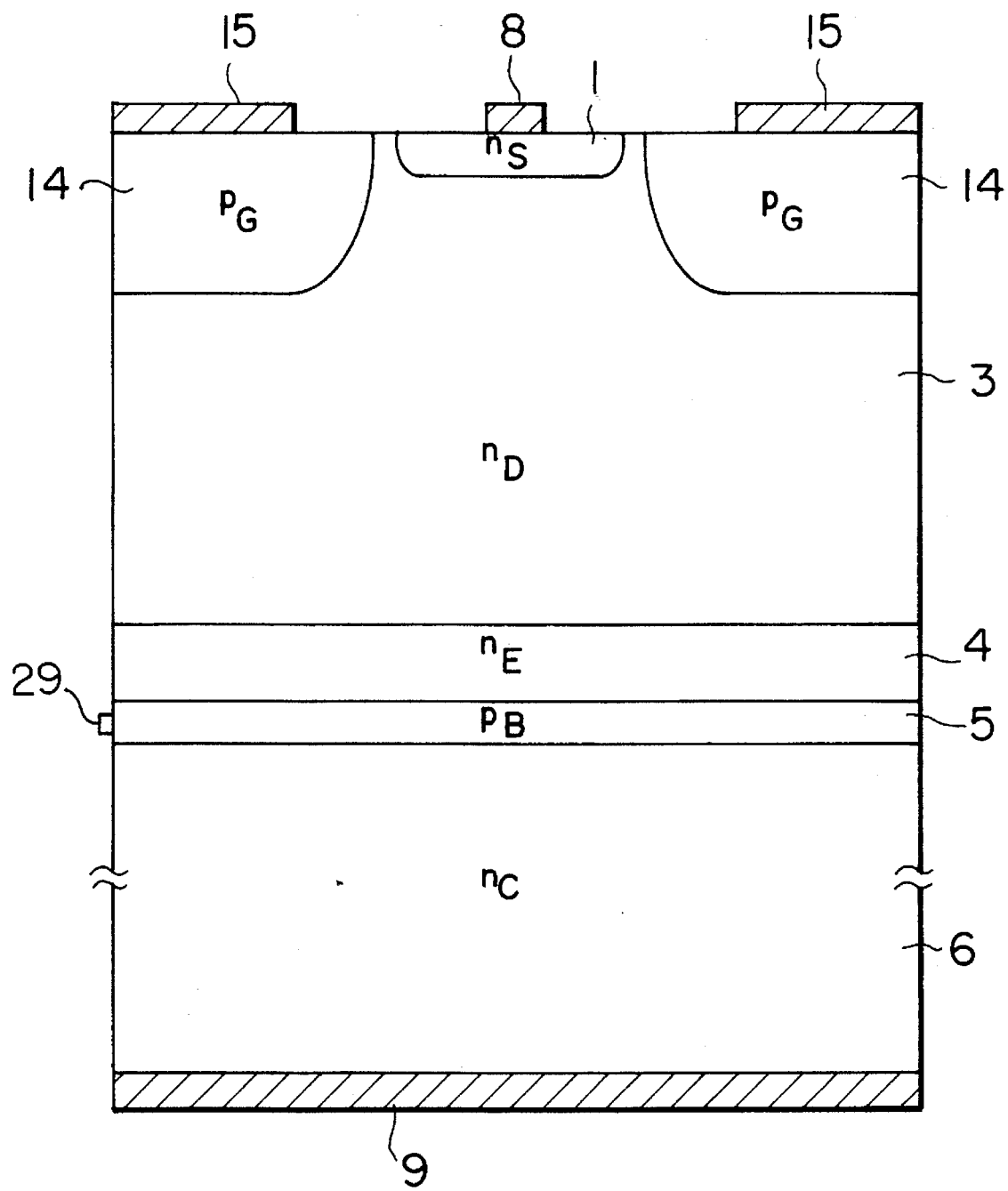
FIG. 5 is a sectional view for explaining a structure of a voltage-driven type semiconductor device according to still another embodiment of the present invention.

FIG. 5 is a sectional view for explaining a structure of a seventh embodiment of the present invention. In FIG. 5, 14 represents a p gate, 15 represents a gate electrode, and other reference numerals are the same as the case in FIG. 1. The seventh embodiment of the present invention shows an example of a voltage-driven type semiconductor device in 600 V, 50 A class.

In the seventh embodiment of the present invention shown in FIG. 5, the voltage-driven type transistor is a normally off type bipolar mode static induction transistor which is kept normally off when bias is not applied. The width of the segment of the device is approximately 30 μm. Further, in the present embodiment, the surface impurity concentrations of the n source 1 and the p gate layer 14 are $5\times10^{19}/cm^3$ and $1\times10^{20}/cm^3$, respectively, the depths of junction are 1.5 μm and 4 μm, the impurity concentration and the thickness of the n drain 3 are $4\times10^{12}/cm^3$ and 80 μm, respectively, and the channel width, i.e., the space between two p gate layers 14 is approximately 10 μm. Other structure parameters are almost the same as those of the first embodiment.

The semiconductor device according to the seventh embodiment of the present invention is turned on by a mechanism described hereunder by bringing the potential of the main electrode 9 into a forward bias state higher than the main electrode 8 and applying the gate voltage so that the potential of the p base 5 becomes higher than that of the n emitter 4 by a predetermined potential (approximately 0.6 V) or higher and the potential of the gate electrode 15 becomes higher than the potential of the main electrode 8 by approximately 0.4 to 0.8 V.

When such a gate voltage as described previously is applied to the gate electrode 15, pinch-off in the region between two p gates 14 is released and a channel is formed. Electrons flow into the n drain 3 from the n source 1 through the formed channel, and then, these electrons flow into the n emitter 4. Thereafter, these electrons are injected into the p base 5 and diffused in the p base 5. The electrons then reach the n collector 6 and flow into the main electrode 9. With this, the illustrated semiconductor device is turned on.

In the seventh embodiment of the present invention shown in FIG. 5, the injection efficiency of electrons into the base and the transfer efficiency of electrons in the base are sufficiently high, and the common base current gain of the bipolar transistor is trially estimated to reach approximately 0.964 as a result of adopting structure parameters described above. As a consequence, the bipolar transistor can be brought into a saturated state easily, and the collector saturation voltage becomes very low. In this example, the collector saturation resistance becomes as low as approximately 4 mΩ.

The breakdown voltage of the semiconductor device to the seventh embodiment of the present invention is approximately 680 V, but the breakdown voltage is principally borne by the static induction transistor, and the breakdown voltage of the bipolar transistor is approximately 10 V at most. As a consequence that the bipolar transistor portion can be made to have low breakdown voltage in the semiconductor device according to the seventh embodiment of the present invention as described above, it is possible to increase the impurity concentration of the n collector 6 sufficiently high. Accordingly, it is possible to control the resistance in the collector portion to be sufficiently low and to realize a very low collector saturation resistance such as described previously. This point is similar to the case of first embodiment of the present invention described previously.

Now, when attention is paid to the static induction transistor portion in the seventh embodiment of the present invention described above, the holes are injected into the n emitter 4 from the p base 5, these holes diffuse in the n emitter 4, and then these holes diffuse in the n drain 3. The n emitter 4 is set at the proper impurity concentration and thickness as described previously. As a consequence, the holes can reach the n drain 3 without vanishing excessively by recombination in the n emitter 4, and the inside of the n drain 3 is filled with enough holes to give rise to sufficient conductivity modulation.

As a result, in the seventh embodiment of the present invention, the resistance of the n drain 3 is reduced to a little less than 1.5 mΩ, and the resistance between the main electrodes can be made to show a sufficiently small value of approximately 14 mΩ. In the seventh embodiment of the present invention, the voltage drop is approximately 1.0 V even at time of 50 A conduction (current density: 100 A/cm$^2$), and the power dissipation shows a sufficiently small value as compared with a voltage-driven type semiconductor device which has been heretofore reported.

Figure 6:
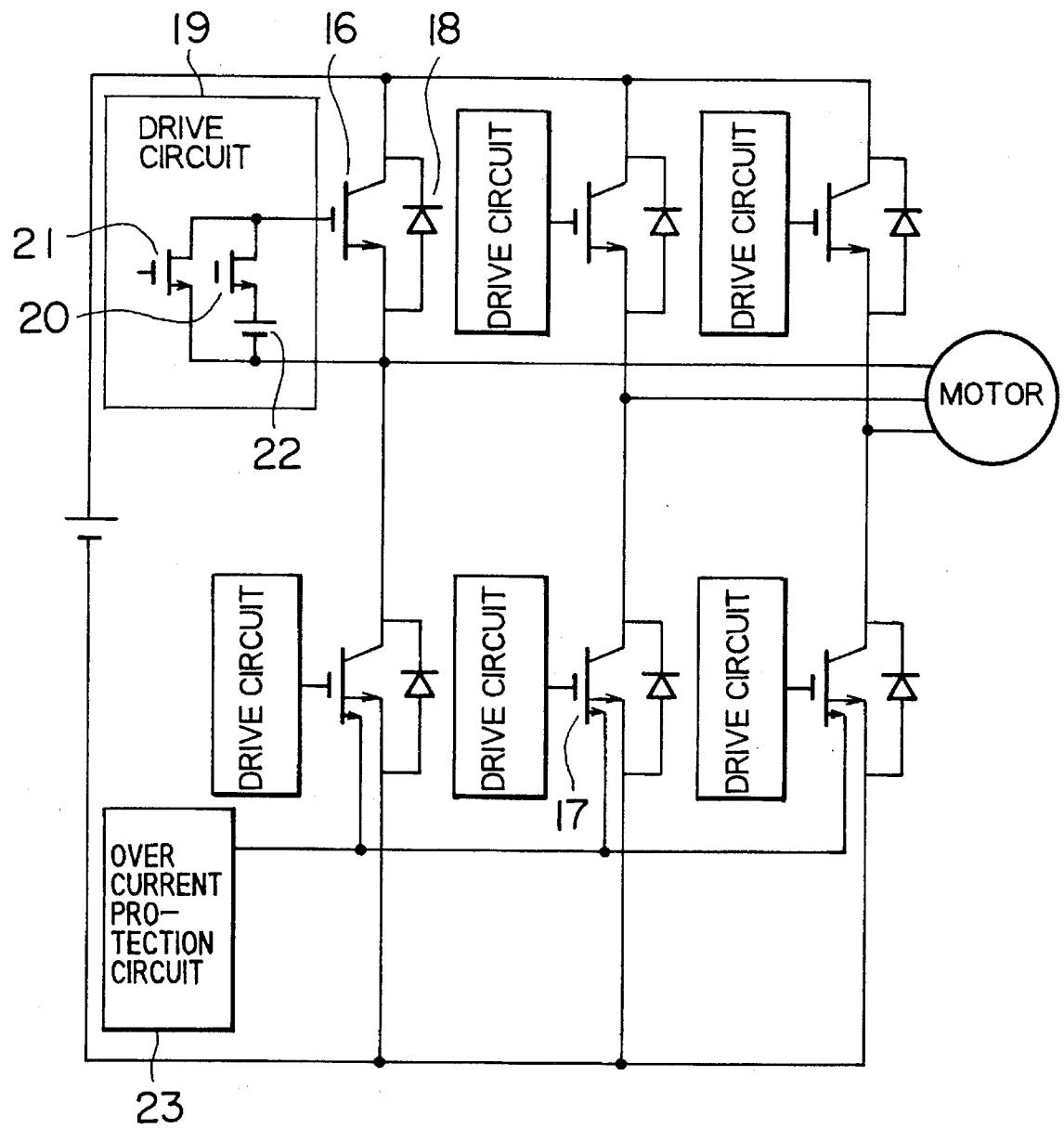
FIG. 6 shows a circuit example using the semiconductor device of the embodiment shown in FIG. 2.

FIG. 6 is a block diagram showing a structure of an eighth embodiment of the present invention. In FIG. 6, 16 represents the voltage-driven type semiconductor device shown in FIG. 2 described previously, 17 represents the voltage-driven type semiconductor device shown in FIG. 2 which contains inside a current sensing element, 18 represents a free wheel diode, 19 represents a gate drive circuit, and 23 represents an over current protection circuit. In the adopted voltage-driven type semiconductor device 16, the p base 5 is not biased. When the p base 5 is biased, the timing of the bias is synchronized with that of the bias of the gate electrode. In such a structure, it is possible to adopt a semiconductor device according to another embodiment.

The eighth embodiment of the present invention shown in FIG. 6 shows an example of an inverter circuit for three phase motor drive constructed by using the voltage-driven type semiconductor device shown in FIG. 2 as a switch.

When a voltage-driven type semiconductor device of the present invention is used as a switch for controlling large electric power, it is used so that a plurality of segments of the voltage-driven type semiconductor device are integrated and made to operate in parallel so as to function as one switch.

In the eighth embodiment of the present invention, a current sensing element contained inside the switch by the voltage-driven type semiconductor device may be formed of a segment similar to the segment of the semiconductor device constituting the switch, and the ratio of the number of segments of the semiconductor device constituting the switch to the current sensing elements was set to 1,000:1.

Further, the free wheel diodes 18 are connected in parallel to respective voltage-driven type semiconductor devices 16 and 17. In a first drive circuit 19 for driving a gate voltage of the voltage-driven type semiconductor device, the principal part thereof is composed of switching elements 20, 21 and a battery 22. When the voltage-driven type semiconductor devices 16 and 17 are the type of any one of those shown in FIGS. 1–5, a second drive circuit (not shown) is inserted between the p base 5 and n emitter 4 to inject holes into the devices. When the devices 16 and 17 are the type of any one of those shown in FIGS. 8–10, a third drive circuit (not show) is coupled to both the p region 30 and electrode 8 to bias a predetermined voltage therebetween.

This first drive circuit 19 is operated so that, when the voltage-driven type semiconductor devices 16, 17 of the illustrated inverter circuit are controlled in an on-state, the switching element 21 is turned off and the switching element 20 is turned on so as to apply the voltage of the battery 22 to the gates of the voltage-driven type semiconductor devices 16 and 17, and when the voltage-driven type semiconductor devices 16 and 17 are controlled in an off-state, the switching element 21 is turned on and the switching element 20 is turned off. In this case, the second and third drive circuits are controlled to continuously provide the predetermined bias voltage in spite of the fact that the first drive circuit 19 is the ON-state or the OFF-state, or to turn-on or turn-off synchronously, with a predetermined interval, with the turn-on or turn-off operation of the first drive circuit 19.

Besides, when an over current is produced when the voltage-driven type semiconductor device 17 is in an on-state, the over current is detected by the current sensing element mentioned previously, and the detection current operates the over current protection circuit 23 thereby to prevent destruction of the semiconductor device. Further, when reverse bias is applied to the voltage-driven type semiconductor devices 16 and 17, the illustrated embodiment is able to prevent latch-up of the parasitic thyristor by the method described with reference to the embodiment 1.

Namely, in this case, in the first drive circuit 19, the switching element 21 is turned off and the switching element 20 is turned on, the voltage of the battery 22 is applied to the gates of the voltage-driven type semiconductor devices 16 and 17, and an nMOSFET between the anode and the base of the parasitic thyristor is turned on, thereby to short-circuit the anode and the base.

The eighth embodiment of the present invention shown in FIG. 6 is able to reduce the power dissipation by a large margin to approximately 55% as compared with the inverter circuit formed of switching elements according to a conventional device by means of the circuit structure described previously. The effect of reduction in power dissipation becomes larger in a high-speed operation range of 15 to 30 KHz.

Besides, in the eighth embodiment of the present invention described above, it is possible to eliminate the free wheel diode 18 by using a semiconductor device obtained by improving the semiconductor device according to the fourth embodiment of the present invention as the voltage-driven type semiconductor devices 16 and 17. Namely, in the fourth embodiment of the present invention shown in FIG. 2, it is possible to have a diode composed of the p⁺ layer 7, the p well 2, the n drain 3, the n emitter 4, the n layer 11 and the n collector 6 function as a free wheel diode by setting the area ratio of the n layer 11 to the p base 5 to 40 to 65%.

Figure 7:
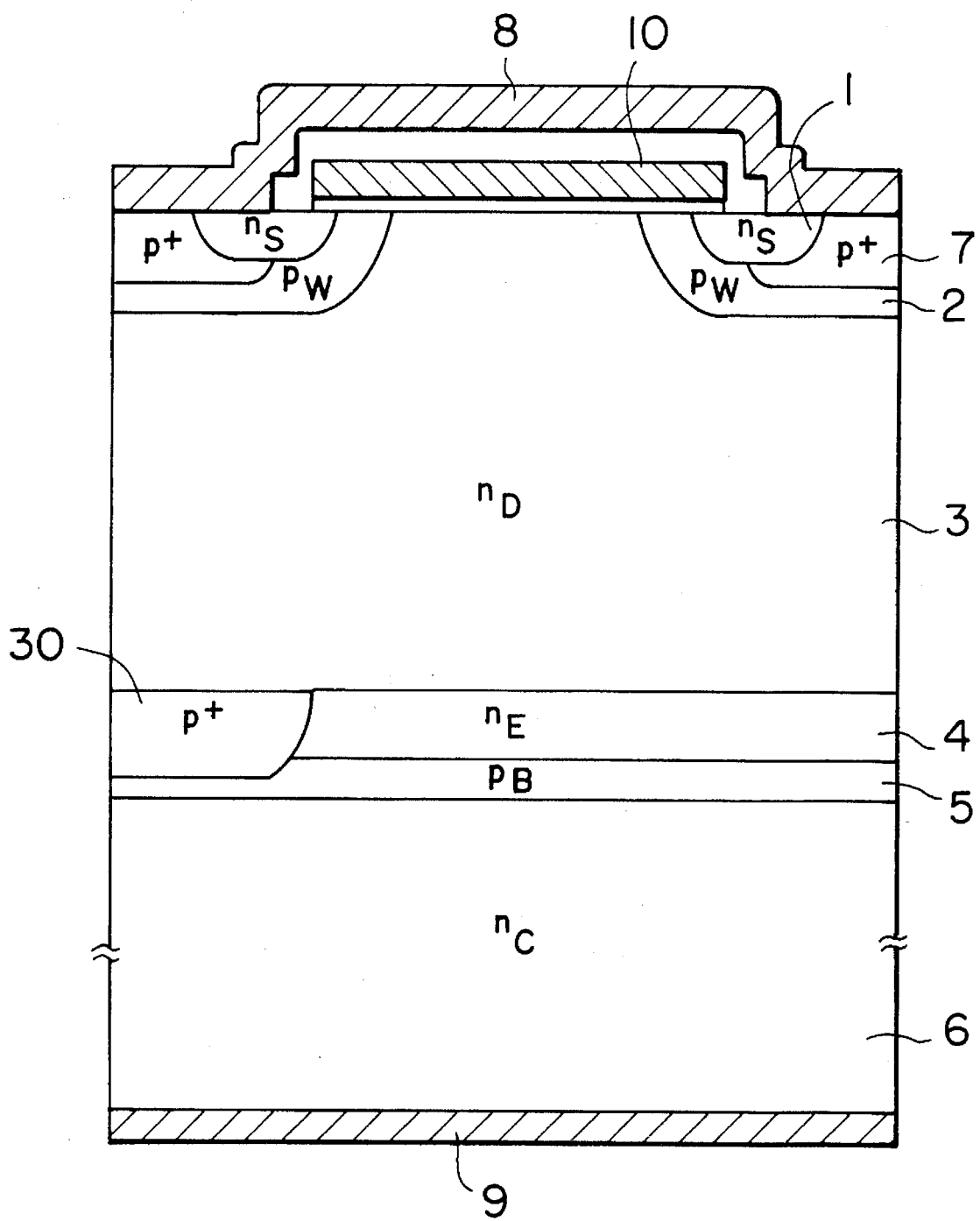
FIG. 7 is a sectional view for explaining a structure of a voltage-driven type semiconductor device according to another embodiment of the present invention.

FIG. 7 shows one segment of the voltage-driven type semiconductor device which is a ninth embodiment of the present invention. Except for the fact that a p layer 30 is formed, the rest is almost the same as the first embodiment. In the case of the present embodiment, the p layer 30 has a depth almost the same as that of the n layer 4, which is approximately 12 μm. The p layer 30 is formed by diffusing boron selectively after growing an n emitter epitaxially on the n collector. As compared with the impurity concentration of the p base is $1\times10^{18}$/cm³, the impurity concentration of the p layer 30 is $3\times10^{19}$/cm³. The thickness of the p base is approximately 1.5 μm, and impurity distribution is controlled so as to realize the transistor performance almost same as that of the first embodiment.

In the semiconductor device according to the present embodiment, the gate voltage is applied so that the potential of the main electrode 9 becomes higher than the potential of the main electrode 8 and the potential of the MOS gate electrode 10 becomes higher than the potential of the main electrode 8, and the semiconductor device is turned on by a mechanism described hereunder when the gate voltage exceeds the threshold voltage. Namely, an n channel is formed on the surface of the p well 2 under the MOS gate 10, and electrons flow into the n drain 3 from the n source 1 through the channel. When forward bias is applied to the n emitter and the p base, and bias is applied so that the potential of the p base becomes higher than the potential of the main electrode 8 by a predetermined value in this state, an npn transistor is operated and the holes are injected into the n drain from the p layer 30 at the same time. It is a matter of course that forward bias is applied to the n emitter and the p base so that the npn transistor is brought into a saturated state.

Since the holes are injected into the n drain from the p base through the n emitter by a mechanism similar to that of the first embodiment as discussed in the foregoing description, the n drain is conductivity-modulated and provides a low resistance. In the case of the present invention, however, the n drain is conductivity-modulated further by means of the holes injected from the p layer 30, thus making it possible to have the n drain show still lower resistance as compared with the first embodiment. Presumably, the resistance between the main electrodes when the present embodiment is in operation becomes smaller to approximately 7 mΩ.

Figure 8:
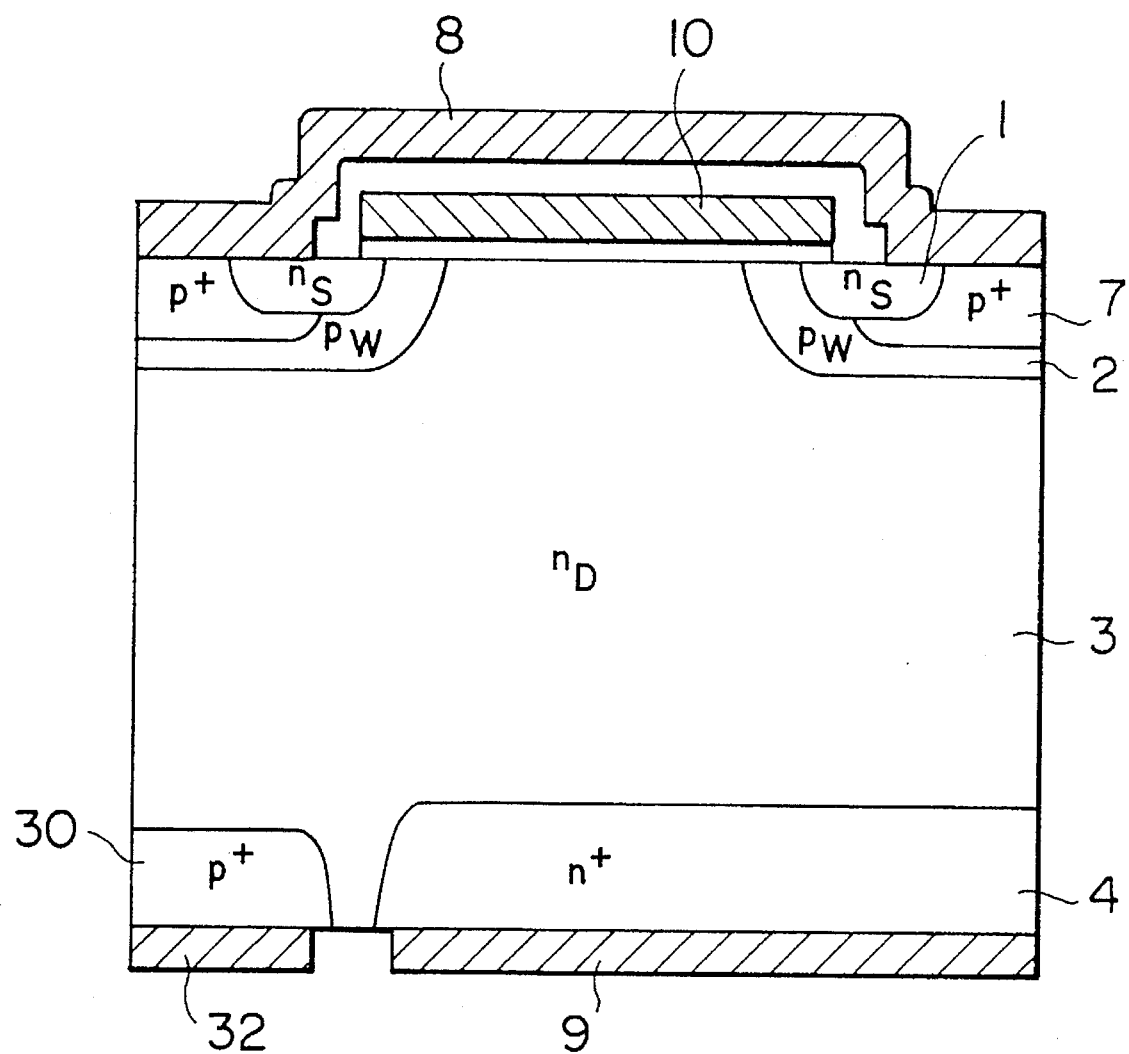
FIG. 8 is a sectional view for explaining a structure of a voltage-driven type semiconductor device according to still another embodiment of the present invention.

FIG. 8 shows one segment of the voltage-driven type semiconductor device of a tenth embodiment according to the present invention. The present embodiment has almost the same structure as the ninth embodiment except the p base 5 and the n collector 6 are removed.

In the semiconductor device according to the present invention, the gate voltage is applied so that the potential of the main electrode 9 becomes higher than the potential of the main electrode 8 and the potential of the MOS gate electrode 10 becomes higher than the potential of the main electrode 8, and the semiconductor device is turned on by a mechanism described hereunder when the gate voltage exceeds a threshold voltage. Namely, an n channel is formed on the surface of the p well 2 under the MOS gate electrode 10, and electrons flow into the n drain 3 from the n source 1 through the channel. When bias is applied so that the potential of an electrode 32 of the p layer 30 becomes higher than the potential of the main electrode 8 by a predetermined value in this state, the holes are injected into the n drain from the p layer 30, and the n drain 3 is conductivity-modulated and can be made low in resistance. Presumably, the resistance between the main electrodes when the present embodiment is in operation can be made as low as approximately 16 mΩ.

Although the resistance between the main electrodes become slightly higher as compared with other embodiments, the present embodiment has a simple structure and has such an advantage that a base current for driving a bipolar transistor is not necessary. As a matter of course, the volt-ampere characteristic between the main electrodes 8 and 9 is practically linear.

Figure 9:
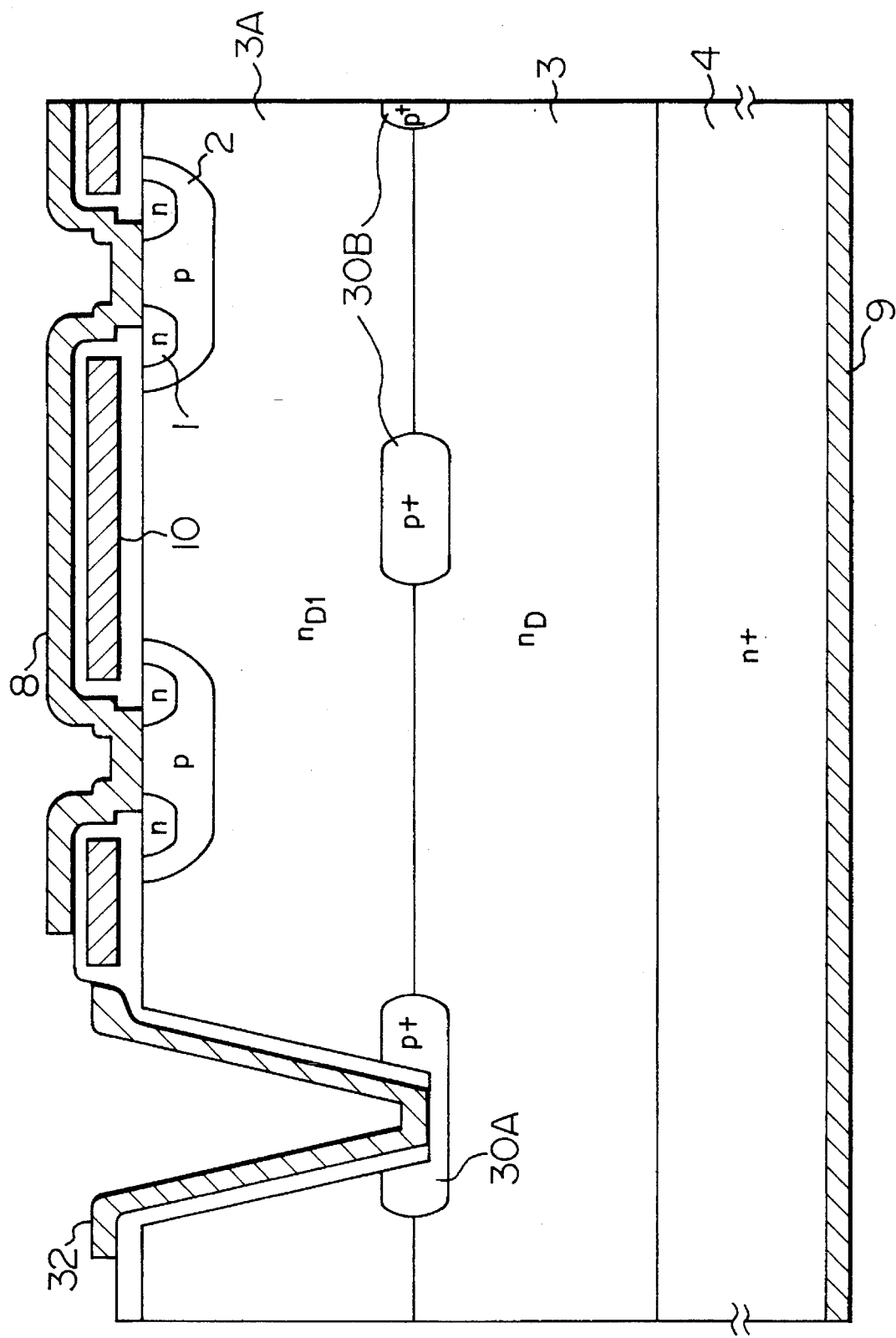
FIG. 9 and FIG. 10 are sectional views showing structures of modification examples of a voltage-driven type semiconductor device according to the embodiment shown in FIG. 8.
Figure 10:
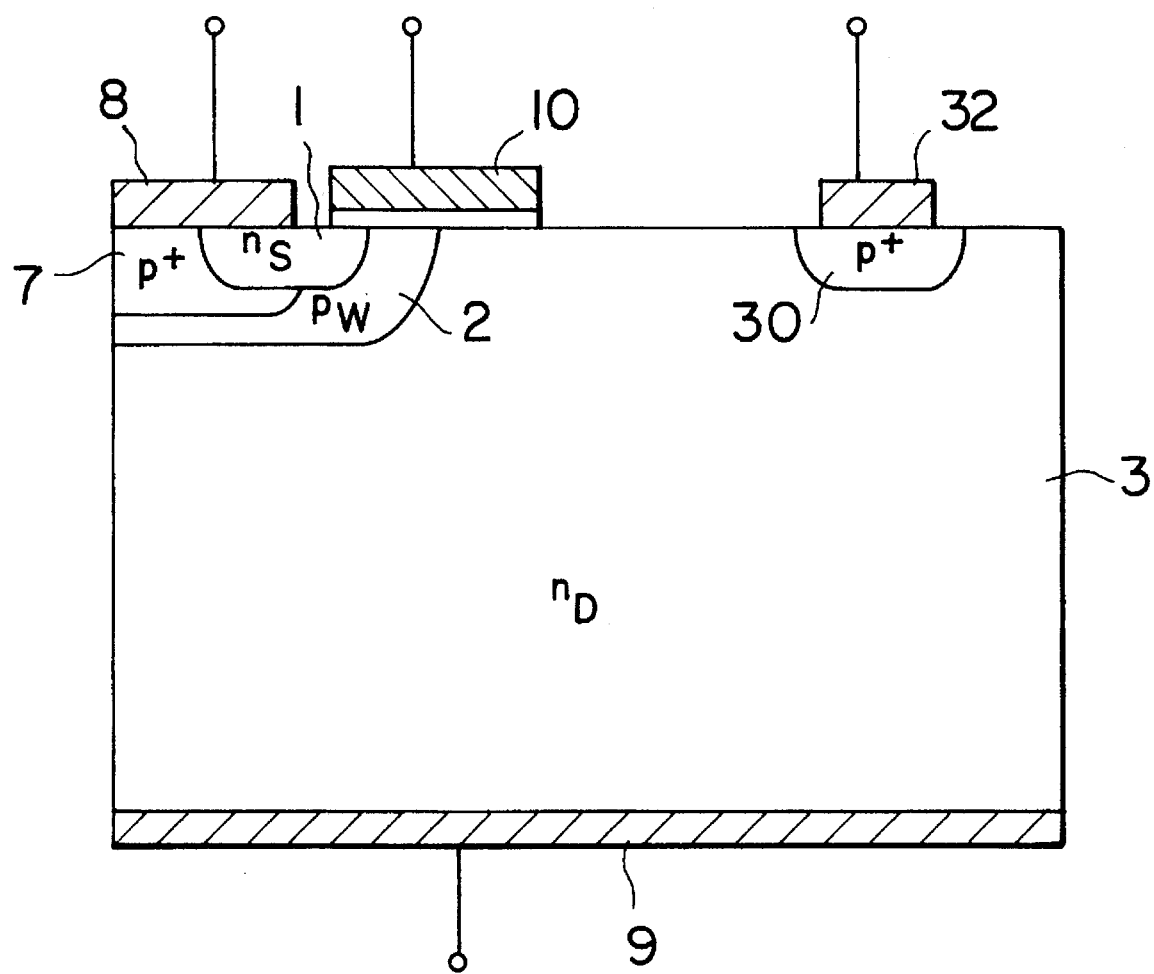

FIGS. 9 and 10 show modification examples of the embodiment shown in FIG. 8. The same reference numbers are assigned to regions and electrodes which are the same as those shown in FIG. 8, and the description thereof is omitted.

In the device shown in FIG. 9, p⁺ region 30B for hole injection is formed. The region 30B is arranged on an electron current path in the device such that the conductivity modulation is carried out effectively. The region 30B is formed integrally inside the device and connected to another p⁺ region 30A. A predetermined potential is applied to the region 30A to inject holes into the device when the device is operated.

The p⁺ region for hole injection can be formed right under the p region 2 on the main surface of the device to eliminate disadvantages resulting from blocking the electron current path by the p⁺ region 30B shown in the figure. In this case, the p⁺ region right under the p region 2 has a lower activity in hole injection than that of the p⁺ region shown in the figure. It is therefore preferable to select the position of the p⁺ region inside the device according to the usage purpose of the device.

A concentration of dopant in a region $n_{p1}$ 3A between the p⁺ hole injecting region 30B and the main surface of the device is controlled by considering which requirement is more significant for the device, voltage drop or breakdown voltage. Namely, the concentration of the dopant should be higher for the purpose of suppressing the voltage drop, while on the contrary, the concentration of the dopant should be lower for the purpose of increasing the breakdown voltage. Of course, it is preferable in same cases to dope the region 3A with the same concentration of the $n_D$ drain region 3.

In the semiconductor device shown in FIG. 10, the p layer 30 is formed on the same plane as the gate electrode 10 and the main electrode 8. Besides, the present embodiment is structured so that the electrode 32 on the p layer 30 is biased independently of the main electrodes 8 and 9 and the gate electrode 10.

As a consequence that the electrode 32 can be biased independently in the embodiments shown in FIGS. 8, 9 and 10, the holes can be injected independently of the electron current flowing in from the MOSFET. Namely, it is possible to reduce the on-voltage and the power dissipation by regulating the hole current in accordance with the use. For example, a large current is required in starting a motor, but it is possible to reduce the on-current and apply a large current by increasing the voltage of the electrode 32 at the time of starting only while maintaining the voltage of the electrode 10 at a constant value. Further, by removing the voltage of the electrode 32 a little earlier than the voltage of the electrode 10 at the time of turn-off, high-speed turn-off unobtainable in an IGBT and a MOS thyristor becomes possible, thus making it possible to reduce the turn-off loss by a large margin. Such features can also be realized similarly in the embodiments shown in FIG. 1 to FIG. 7, which can be achieved by controlling the voltage applied to a semiconductor layer 5 in place of the electrode 32 independently of the electrode 10 or 15.

The present invention is not necessarily limited to the embodiments described above, but various modifications can be made therein, and it is applicable to various types of equipment.

For example, in the first embodiment of the present invention, it is possible to realize a large electric power semiconductor device in the 4,000 V.100 A class by altering structure parameters as described hereunder. Namely, as the structure parameters, the segment width is set to 130 µm, surface impurity concentrations of the n source 1 and the p well 2 to $5\times10^{20}$/cm$^3$ and $1\times10^{18}$/cm$^3$, respectively, junction depths thereof to 15 µm and 50 µm, impurity concentrations of respective layers of the n drain 3, the n emitter 4, the p base 5 and the n collector 6 to $1\times10^{13}$/cm$^3$, $1\times10^{18}$/cm$^3$, $1\times10^{18}$/cm$^3$ and $1\times10^{17}$/cm$^3$, respectively, and the thicknesses to 600 µm, 20 µm, 2 µm and 200 µm, respectively.

In a semiconductor device having such structure parameters, the voltage drop of the semiconductor device is approximately 1.35 V at a time of 100 A conduction (current density: 100 A/cm$^2$), and a high-speed operation is possible as compared with a current-driven type semiconductor device which has been heretofore reported, thus making it possible to obtain a much smaller value of power dissipation at a time of high-speed operation.

Further, in the seventh embodiment of the present invention described with reference to FIG. 5, the voltage-driven type transistor portion may be replaced with a normally-on type unipolar mode static induction transistor which is turned on at a normal time when no bias is applied. In this case, the voltage-driven type semiconductor device performs the normally-on operation, and can achieve sufficiently small power dissipation as compared with a voltage-driven type semiconductor device which has been heretofore reported. Further, in this example, the semiconductor device can be turned off easily by applying reverse bias in the order of several volts to the gate. Furthermore, a junction FET may be adopted for the voltage-driven type transistor portion, and a Darlington transistor may also be adopted for the bipolar transistor portion.

Further, bias voltage is applied for driving a bipolar transistor in the embodiments of the present invention described previously, but an optical drive method or the like for generating carriers in the base by a light of a light emitting diode is applicable likewise in the present invention.

Moreover, the present invention is neither limited to the examples described in the above-described embodiments with respect to a method of manufacturing a semiconductor device of the present invention.

For example, it is also effective in the present invention to use a well-known Si wafer direct bonding method in the manufacture of the semiconductor devices shown in FIGS. 1, 2 and 5. Namely, it is also possible to form a bipolar transistor on one wafer and bond it directly with another wafer thereafter, thereby to form a voltage-driven type transistor such as a MOSFET and a static induction transistor after lapping and polishing to a predetermined thickness. In this case, it is possible to restrain collapsing of the abrupt impurity distribution of the n emitter 4 and the p base 5, and to form the bipolar transistor having a lower collector saturation resistance as compared with a method of forming three layers epitaxially. At the same time, rationalization of the holes injected into the n emitter 4 from the base becomes easier, and high performance of a voltage-driven type semiconductor device can be aimed at.

Figure 11:
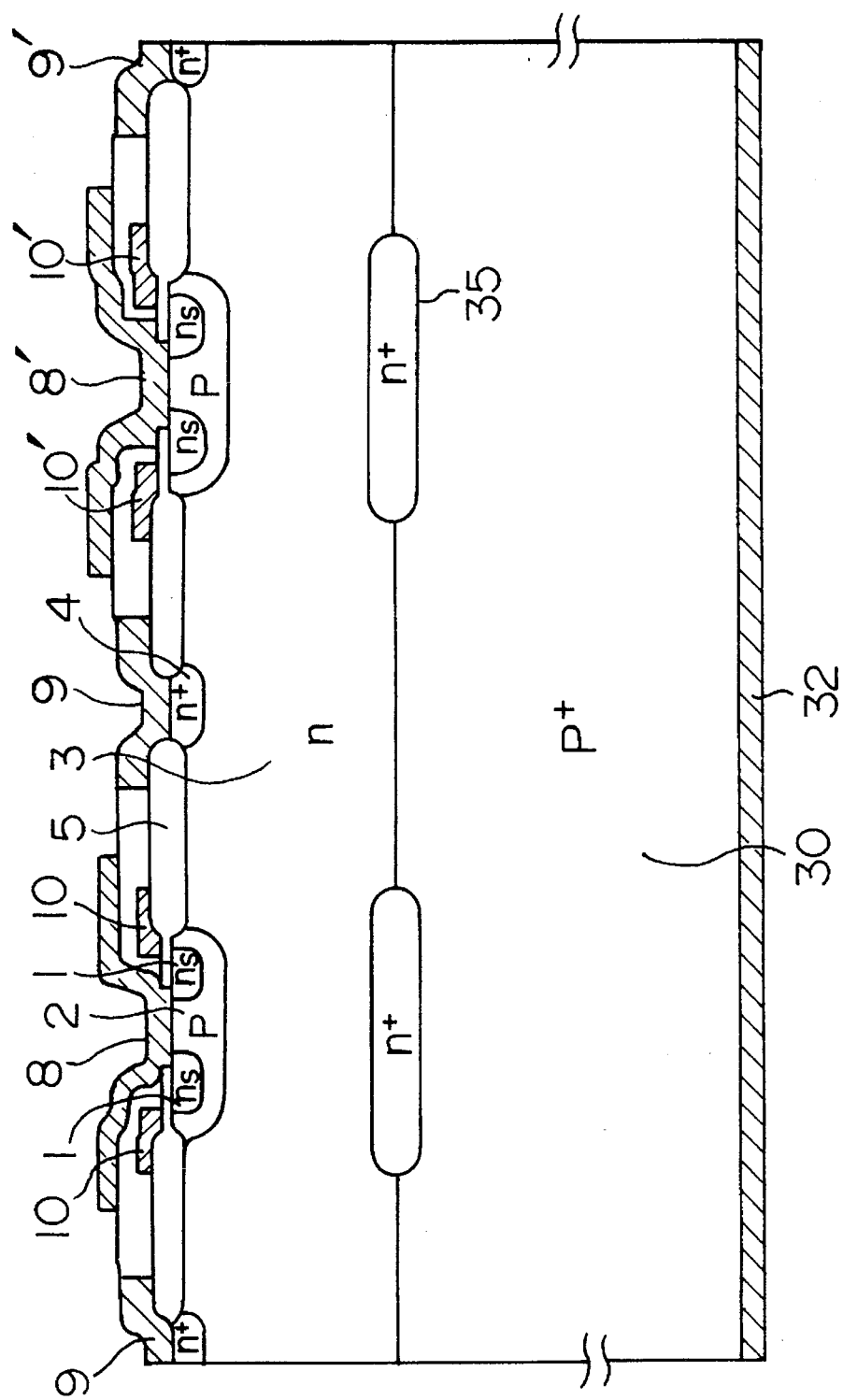
FIG. 11 shows a sectional view for explaining two segments of the device according to the another embodiment of the invention.

FIG. 11 shows two segments of the voltage driven type semiconductor devices in the 600 V.100 A class according to the another embodiment of the present invention. Each segment is about 150 µm in width. The remainder structure parameters are as follows. Surface impurity concentration of respective layers, an n source 1, a p well 2 and an n drain 3 are $5\times10^{18}$/cm$^3$, $5\times10^{17}$/cm$^3$ and $1.3\times10^{14}$/cm$^3$. Depths or depths of junction thereof are 1.5 µm, 3 µm and 60 µm. Impurity concentration of an n$^+$ drain contact 4 is $5\times10^{19}$/cm$^3$ and thickness thereof is 1.5 µm. A p$^+$ layer 30 is a base semiconductor region for injecting carriers into the drain 3 and impurity concentration and thickness thereof are $5\times10^{18}$/cm$^3$ and 450 µm, respectively. Heavily doped n$^+$ layer 35 prevents the device from latching-up such that the control of the device with the gate should be kept.

In the semiconductor device shown in FIG. 11, the potential on a main electrode 9 is set higher than that of another main electrode 8 and a gate voltage is applied to a MOS gate electrode 10 so that the potential on the MOS gate electrode 10 is higher than that of the main electrode 8. The device turns on when the gate voltage exceeds a predetermined threshold voltage. In such a condition, i.e. the gate voltage exceeds the threshold voltage, when a further voltage is applied to an electrode 32 to set the potential on the p$^+$ layer 30 higher than that of the n drain 3 by a predetermined voltage (approximately 0.7 V), carriers are injected into the n drain 3 from the p$^+$ layer 30 to cause the conductivity modulation so that the on-resistance between the main electrodes decreases.

When the segment shown in the figure has a straight-line shape, several hundred of segments can be integrated in a device. In that case, the main electrodes 8 and 8', the other main electrodes 9 and 9', and MOS gate electrodes 10 and 10' are electrically connected to each other, respectively. The breakdown voltage of the device is approximately 630 V. When a voltage is applied between the main electrodes 8 and 9 of 1 V, a gate voltage is applied to the MOS gate electrode 10 of 15 V, and a voltage is applied between the main electrode 8 and p$^+$ layer 30 of 1.5 V, the on-resistance is sufficiently low as it is approximately 12 mΩ. Voltage drop is approximately 1.1 V and the power dissipation is approximately 120 W in the device at the time of 100 A conduction (current density: 100 A/cm$_2$). These are clearly lower than those of conventional voltage driven type semiconductor device.

The device is subjected to electron beam irradiation to shorten turn-off time thereof, and the turn-off time is approximately 0.8 µs. Further, according to the device, a threshold current density in which latch-up phenomenon would appear between the main electrode 8 and gate electrode 32 becomes sufficiently high and reaches 900 A/cm$^2$ or higher because of reduction of resistance in the p well 2 under the n source 1 by means of reduction in width of the n source 1 and by means of formation for the p$^+$ layer 30 and further because of control for injection of holes from the p$^+$ layer 30 into the portion of the n drain 3 right under the p well 2 by the n$^+$ layer 35. Furthermore, an n layer (not shown), which is more lightly doped than the n$^+$ layer 35 and is more heavily doped than the n drain 3, can be formed as an improvement of the device between the n$^+$ layers 35 and 35 shown in the figure and on the boundary between the p$^+$ layer 30 and the n drain 3 such that the threshold current density becomes higher and reaches 1100 A/cm² or the high.

In addition to the above-mentioned advantages that the device can reduce power dissipation, the device can also increase tolerance for destruction thereof when it is short-circuited. During an operation mode where the on-resistance is kept lower by means of the conductivity modulation by the injection of carriers into the drain region 3, if an accident, e.g. a load (not shown) is short-circuited, takes place, the injection of carriers into the drain region is prevented because a voltage which has an approximately equal potential to a power voltage is applied to the drain region 3 such that the potential thereof becomes extremely higher than that of p⁺ semiconductor layer 30. Accordingly, the conductivity modulation is stopped such that the on-resistance increases. This results in suppressing a current through the semiconductor device, and therefore, the tolerance of device increases.

Furthermore, the various embodiments shown in the drawing can be manufactured with a well-known process for power-MOS devices. The process for the device of the present invention does not require any special steps. The device thereby can be manufactured easily.

As described above, according to the present invention, it is possible to inject the holes into the drain of the voltage-driven type semiconductor device by a bipolar transistor having a very small collector saturation resistance so as to give rise to conductivity modulation in the drain. As a result, the power dissipation of the voltage-driven type semiconductor device can be made very small, and further, when it is assumed that the power dissipation is the same as before, the turn-off time of the voltage-driven type semiconductor device is shortened thereby enabling high-speed operation.

According to the present invention, a remarkable effect of reduction the in power dissipation and an effect of shortening turn-off time are obtainable in the use for high breakdown voltage and large current in particular.

The present invention has been described in detail, but it should be understood that various changes, substitutions and alterations can be made hereto without departing from the spirit and scope of the present invention as defined by the appended claims.

We claim:

1. A voltage-driven type semiconductor device comprising:

a first device having a linear volt-ampere characteristic, said first device including a first semiconductor region of first conductivity type said first device being provided with a first electrode applied with drive voltage at a first surface thereof, and having a pair of main electrodes to provide a predetermined voltage across the first semiconductor region;

a second semiconductor region, distinct from the first device, of a second conductivity type located at a position at a distance from said first surface of said first device and for injecting carriers into said first semiconductor region so as to modulate conductivity thereof;

a second electrode coupled to said second semiconductor region, wherein said second semiconductor region is formed on a plane opposite to said first surface in said first device wherein said first device portion is comprised of a voltage-driven type transistor, said first semiconductor region is a drain region of said voltage-driven type transistor, said second semiconductor region is a base of a bipolar transistor, and wherein said first and second semiconductor regions have the opposite conductivity type, and are coupled with each other through an emitter region of said bipolar transistor, and wherein a third semiconductor region for connecting a collector region and said emitter region with each other is provided in the base region of said bipolar transistor, and said third semiconductor region has the same conductivity type as that of said emitter.

2. A voltage-driven type semiconductor device comprising:

a first semiconductor region of a first conductivity type having a pair of main surfaces;

a second semiconductor region of a second conductivity type coupled with one of said pair of main surfaces of said first semiconductor region;

a third semiconductor region of the first conductivity type coupled with said second semiconductor region;

a fourth semiconductor region of the first conductivity type coupled with the other main surface of said first semiconductor region;

a fifth semiconductor region of the second conductivity type coupled with said fourth semiconductor region;

a sixth semiconductor region of the first conductivity type coupled with said fifth semiconductor region;

a gate electrode arranged on a date insulator over a portion of said second semiconductor region between said first semiconductor region and said third semiconductor region;

a first main electrode contacting with said second semiconductor region and said third semiconductor region; and a second main electrode contacting with said sixth semiconductor region, wherein said second semiconductor region and said fifth semiconductor region are buried so as to be exposed on the main surface of said first semiconductor region, said third semiconductor region is buried in said second semiconductor region and said sixth semiconductor region is buried in said fifth semiconductor region.

* * * * *